United States Patent [19]
Kakei et al.

[11] 3,931,789
[45] Jan. 13, 1976

[54] VAPOR DEPOSITION APPARATUS

[75] Inventors: Mitsuo Kakei, Tokyo; Keijiro Nishida, Kanagawa; Tadayoshi Kasahara, Hino; Masao Shimabayashi, Kawasaki; Ryozo Hiraga; Tomomasa Nakano, both of Yokohama; Ichiro Komatsubara, Tokyo, all of Japan

[73] Assignee: Canon Kabushiki Kaisha, Japan

[22] Filed: Apr. 19, 1974

[21] Appl. No.: 462,504

[30] Foreign Application Priority Data
Apr. 28, 1973  Japan.............................. 48-48674

[52] U.S. Cl. .................... 118/49; 118/58; 118/503; 214/17 B
[51] Int. Cl.² ......................................... C23C 13/08
[58] Field of Search ........................... 118/48–49.5, 118/500–503, 620, 641–643; 219/388; 148/174, 175; 117/106–107.2, 201; 432/1 NQ; 34/1 NQ; 214/17 B; 427/1 NQ

[56] References Cited
UNITED STATES PATENTS

| | | | |
|---|---|---|---|
| 2,887,411 | 5/1959 | Hoppe et al. | 117/200 |
| 3,086,882 | 4/1963 | Smith, Jr. et al. | 118/49.1 X |
| 3,404,661 | 10/1968 | Mathias et al. | 118/503 X |
| 3,473,954 | 10/1969 | Mattson | 118/48 X |
| 3,568,632 | 3/1971 | Cawthon | 118/49 |
| 3,632,406 | 1/1972 | Clough et al. | 117/107.1 |
| 3,656,454 | 4/1972 | Schroeder | 118/49 |

FOREIGN PATENTS OR APPLICATIONS
1,470,757  1/1967  France ............... 117/107 R

*Primary Examiner*—Morris Kaplan
*Attorney, Agent, or Firm*—Toren, McGeady and Stanger

[57] ABSTRACT

An apparatus for continuously processing articles includes a pre-heating chamber for confining a vacuum therein provided with four openings by which an entrance chamber, two depositing chamber and an exit chamber communicate therewith individually. Each of the openings is provided with a gate valve mounted therein for covering the openings, and particularly the entrance and exit chambers serving to maintain the vacuum in the pre-heating chamber at a predetermined level while feeding unprocessed articles to and removing the processed articles from the pre-heating chamber in such a manner that the vacuum is not affected by the ambient atmosphere. The pre-heating chamber comprises a cylindrical housing in which a water-wheel-like conveyor having means for receiving and holding vacuum deposition jigs carrying articles such as optical elements is intermittently rotated to advance the vacuum deposition jigs through the pre-heating chamber. This feature of the invention facilitates reduction in the heating time per jig. In addition, the automatic inversion of the jig in half revolution of the conveyor serves to facilitate successive applications of a thin film coating on the opposite surfaces of the articles without breaking the vacuum in the processing chambers while insuring that each of the articles is treated identically to produce uniform properties of the thin film coating.

8 Claims, 5 Drawing Figures

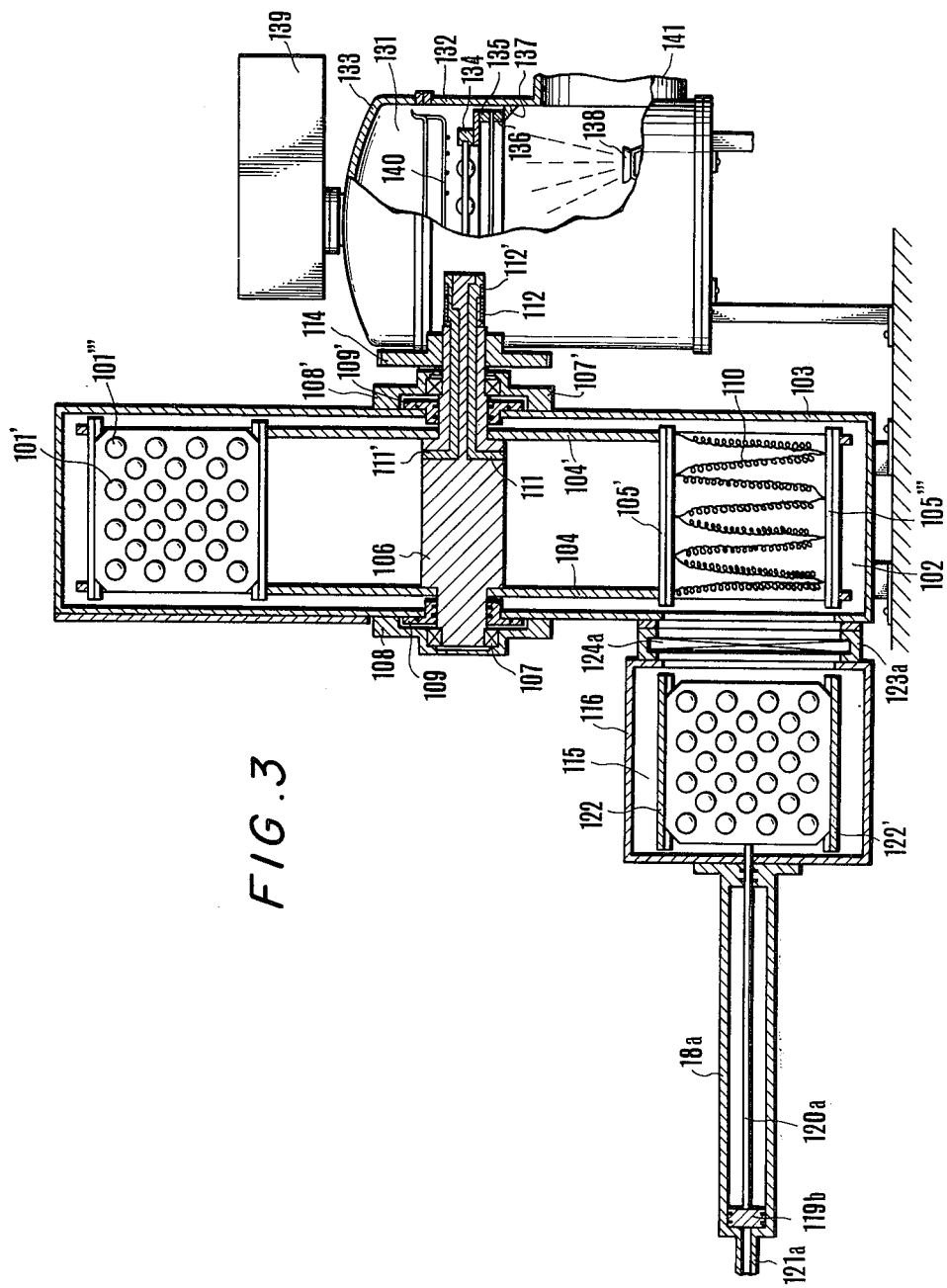

VAPOR DEPOSITION APPARATUS

BACKGROUND OF THE INVENTION

This invention relates generally to an apparatus capable of continuous processing of articles, and more particularly it relates to a pre-heating chamber adapted for use in an apparatus for continuously processing a great number of optical elements such as lenses and mirrors at one time for successive application of a thin film coating on the opposite surfaces thereof which the apparatus is extremely reduced in dimensions by the provision of such pre-heating chamber.

One of the most common vacuum depositing techniques utilizes a bell jar of high vacuum in which a batch of substrates to be coated are simultaneously exposed to the vapor of material to be deposited as a thin film on the substrates. Since the bell jar must be opened after each depositing operation is completed in order to remove the processed substrates and replace them with a new batch of unprocessed substrates, the bell jar method is extremely time-consuming.

Continuous processing of substrates has been developed in the prior art to overcome the above-mentioned disadvantage of the bell jar method. For example, one method of continuous processing employs an entrance chamber, a pre-heating chamber, a depositing chamber, a cooling down chamber and an exit chamber connected in series by pass-ways having internal sealing means mounted therein through which substrates are advanced to coat the substrates with a layer of material. The substrates are mounted on individual work carriers, or vacuum deposition jig (hereinafter simply referred to as "jig") as illustrated in FIG. 1 wherein a number of optical elements 11 to be coated are mounted on a jig 10. After the jig is positioned in the entrance chamber, a vacuum source connected thereto is operated to evacuate the chamber. When the pressure in the chamber has reached a vacuum level of as high as $3 \times 10^{-5}$ torrs at which the interiors of the other chambers, i.e., pre-heating chamber, depositing chamber and cooling down chamber also maintained, the jig is transferred from the entrance chamber to the pre-heating chamber in which the optical elements are heated by a radient energy heater to a predetermined temperature, e.g., approximately 200°–300°C for a period of time, e.g., approximately 20–40 minutes, these conditions being dependent upon the material of optical elements to be coated. The pre-heating of the substrates drives off adsorbing gases and volatile surface contaminates to clean the substrate surfaces and render them suitable for receiving the deposition coating strongly adherent thereto, thus being essential in the vacuum deposition coating processes. From the pre-heating chamber, the jig is transferred into the depositing chamber to apply a coating of a predetermined thickness on either of the surfaces of each of the elements while rotating the jig usually in a horizontal plane to effect uniformity of thin film characteristics. Upon completion of vacuum depositing operation, the jig is advanced past the cooling down chamber to the exit chamber from which it is removed to outside.

In such a process, the depositing operation requires about 1–2 minutes for application of a monolayer coating and about 4–5 minutes per layer for application of a multilayer coating, while the pre-heating treatment requires 20–40 minutes, occupying a large proportion of the period of time necessary for one cycle of processing operation, or the time interval between the feeding of a jig and the removing of the processed jig, thereby the efficiency of the apparatus is extremely reduced. To effect an increase in the efficiency, the depositing chamber may be provided with a necessary number of additional pre-heating and cooling chambers connected in parallel thereto. But this complexity makes the resulting apparatus quite bulky.

For successive applications of a coating on the opposite surfaces of a substrate, after the substrate is processed in a processing chamber to apply a coating on either of the surfaces thereof, the once processed substrate is removed from the processing chamber into the ambient atmosphere where the substrate is inverted, and then the inverted substrate is inserted in the same processing chamber in which an identical processing operation is repeated to apply a coating on the opposite surface thereof. Such a double processing procedure also requires a considerably long processing time. In addition, a drawback encountered by the necessity of inverting the once processed substrate in the ambient atmosphere is such that since the substrate as well as the processing chamber are susceptible to contamination by the surrounding atmosphere and from the fragments of coating material adhering to the jig framework, impurities may accumulate on the substrate surface to be coated subsequently. Therefore it is necessary to incorporate into an operating cycle for the double processing an additional pre-cleaning treatment prior to the second depositing treatment, or otherwise it is difficult to control the properties of the deposited film produced by different depositing operations in the same apparatus.

One conventional double processing method utilizes a bell jar in which a jig is placed in a vertically disposed position between two boards containing a material to be deposited, from which the vapor of the material is allowed to deposit on the opposite surfaces of the substrate simultaneously. Since application of a coating is made on the opposite surfaces of the substrate in one time, the processing time is comparatively short. However, in order to make the thickness of the coating deposited on the substrate uniform, it is more desirable to set the jig in the horizontally disposed position during the depositing operation.

SUMMARY OF THE INVENTION

An object of the present invention is to provide an apparatus capable of continuous processing of articles which apparatus is of extremely reduced dimensions.

Another object of the present invention is to provide an apparatus for continuously processing articles having a pre-heating chamber provided with a mechanism for transporting articles therethrough which permits a reduction in the pre-heating time per article to facilitate a highly efficient processing operation.

A further object of the present invention is to provide an apparatus for continuously processing article having a pre-heating chamber provided with a mechanism for transporting articles therethrough which permits successive applications of a thin film coating on the opposite surfaces of an article without using any other complicated mechanism.

To achieve the above-mentioned objects, the present invention contemplates the use of a novel substrate-transporting device which is, in a preferred form, a rotary conveyor having a number of pairs of an upper and lower grooved rails fixedly mounted therein in parallel to the rotary axis and radially spaced from each other by a distance sufficient to hold a jig therebetween and which is operated within the vacuum tightly sealed housing of the pre-heating chamber. A radient energy heater such as nichrome wire or an infra-red radient source is provided on each side of the jig. If all of the jig holders of the rotary conveyor receive jigs, the resultant shape of the conveyor resembles to a water-wheel. It is to be understood from the radial arrangement of jigs that a great number of jigs may be processed at one time within the housing of small dimension. As far as minimization of dimension of the apparatus is concerned, the jig-transporting device may be formed by a pair of endless chains supported by two sprockets spaced apart by a distance and having means for receiving and holding jigs in positions perpendicular to the chains. But facilities for power supply and vacuum-tight seal of the housing are made considerably complicated.

Another advantage of the rotary conveyor of the invention is that when it is installed with the shaft parallel to the installation ground, each of the jigs radially arranged in the conveyor is automatically inverted half revolution as the conveyor is rotated about the shaft. In other words, when a jig is advanced from a position to that symmetrical thereto with respect to the rotary shaft, the automatical inversion of the jig is effected. Therefore, a pair of depositing chambers may be preferably arranged in the positions symmetrical to each other with respect to the rotary shaft so that sequential double processing of a substrate can be carried out without manual inverting operation or any particular mechanism therefor. In the case of a rotary conveyor with the vertically disposed shaft to the installation ground, where the jigs are vertically arranged at all the angular positions of the conveyor, it is necessary to provide a mechanism for transferring a jig from the jig holder to the depositing chamber and placing the transferred jig horizontally. Even in this case, the mechanism may be of a simpler structure than that of the mechanism for inverting the jig. Of course, the provision of only one depositing chamber for continuous but single processing of substrate is included in the scope of the present invention. With the conveyor constructed in accordance with the invention it is possible to control the pre-heating time per jig in an appropriate proportion to the processing time by various ways to be described later in detail. In the apparatus of the present invention, the jig once inserted into the pre-heating chamber is not exposed to the ambient atmosphere until the double processing thereof is completed, thereby the possibility of impurities accumulating on the surfaces of the substrates from the ambient atmosphere is substantially reduced to produce uniform characteristics in the deposited layer. Further the exclusion of the second pre-cleaning operation from the double processing operation increases the efficiency of the apparatus of the invention.

BRIEF DESCRIPTION OF THE DRAWINGS

FIG. 3 is a sectional view, partly in perspective with portions broken away, taken on the line III—III of FIG. 2.

DESCRIPTION OF THE PREFERRED EMBODIMENTS

Figure 4:
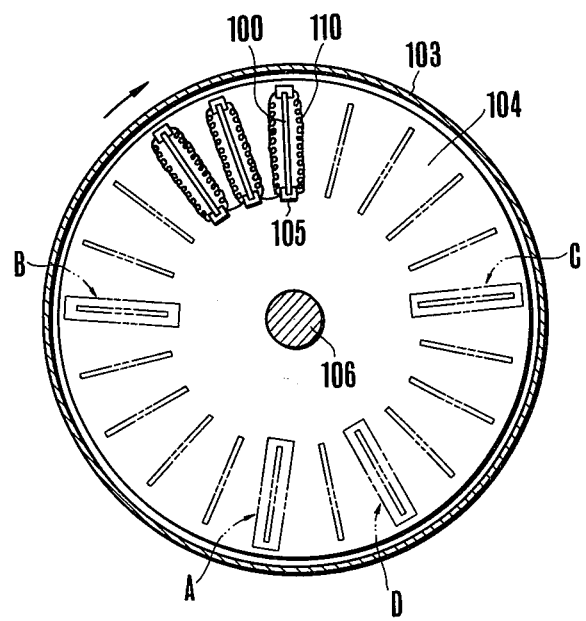
FIG. 4 is a sectional view taken on the line IV—IV of FIG. 2.
Figure 1:
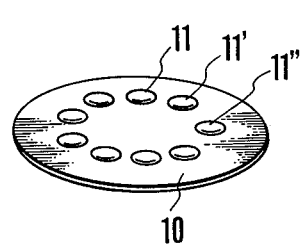
FIG. 1 is a perspective view of a jig having a number of lenses rigidly secured therein.
Figure 2:
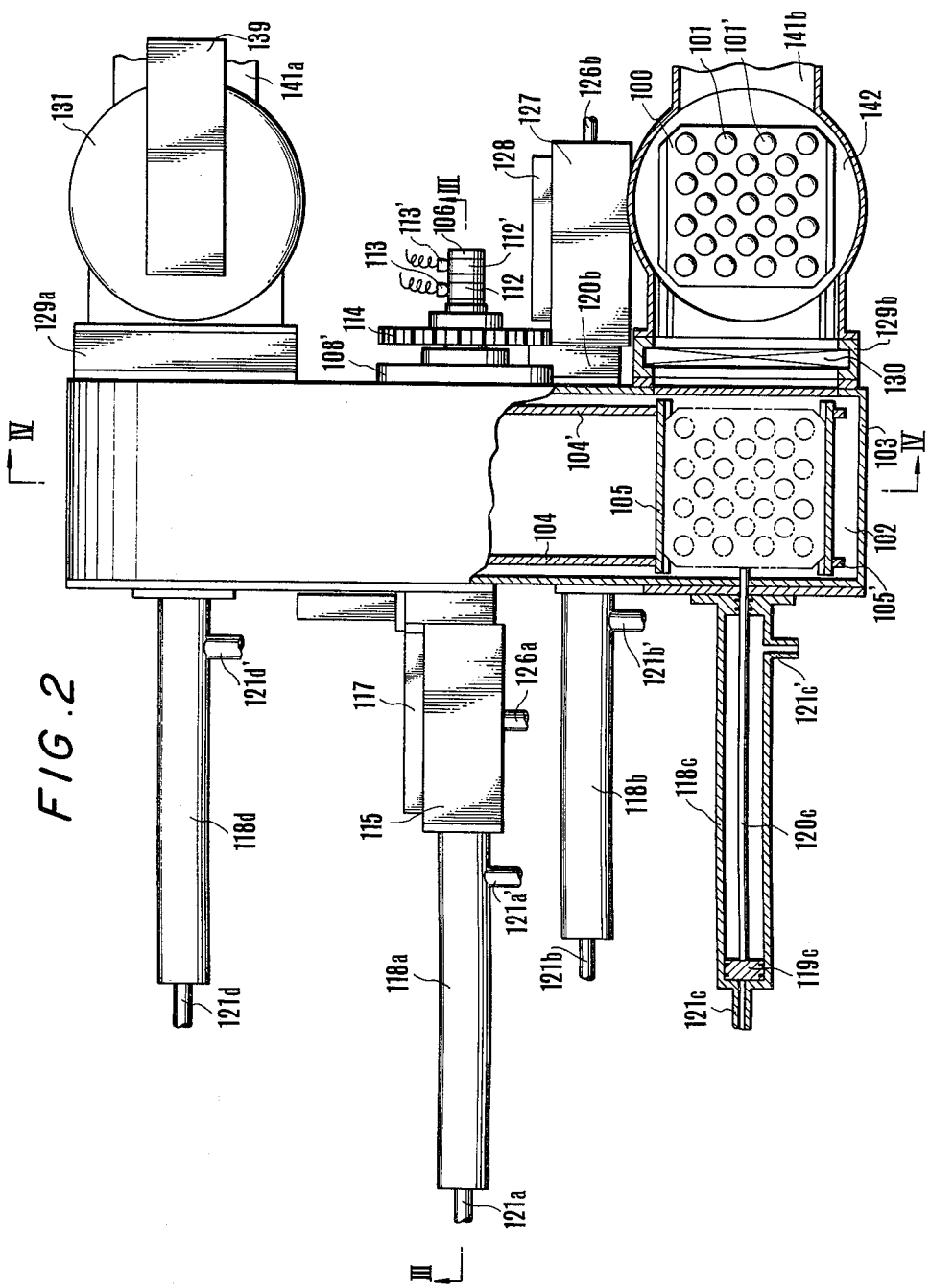
FIG. 2 is a top plan view of one form of the apparatus of the present invention with portions of the housing thereof broken away.

Referring to FIGS. 2, 3 and 4, a vacuum deposition apparatus in accordance with a preferred embodiment of the present invention comprises an entrance air lock chamber 115, a pair of depositing chambers 131 and 142, an exit air lock chamber 127, each connected to a pre-heating chamber 102. The pre-heating chamber 102 comprises a cylindrical housing 103 in which a rotary conveyor formed by a drive shaft 106 in combination with a pair of disks 104 and 104' fixedly mounted thereon at the centers of the disks is located. Fixedly mounted on the peripherals of the disks 104 and 104', an odd number of, in this instance twenty-one, members for receiving and holding jigs, each of the members being constructed in the form of a pair of an upper grooved rail 105 and a lower grooved rail 105' spaced apart by a distance sufficient to receive and hold a jig 100. Each of the jigs 100 carries a number of substrates such as lens elements to be coated rigidly secured therein in a manner known in the art. The drive shaft 106 is supported by means such as anti-friction bearings 107, 107' in bearing cases 108 and 108' mounted in the front and rear walls of the pre-heating chamber as viewed from the front (entrance) side of the apparatus respectively. The jigs are positioned as surrounded by nichrome wires 110 for heating the substrates which are connected in parallel or in series to a pair of conductors 111 and 111' terminating at the slip rings 112 and 112' contacted with sliders 113 and 113' respectively. The rotary conveyor is driven into rotation through a gear 114 fixedly mounted on the drive shaft 106. In addition to the driving of the shaft 106 in a controlled speed by engagement with a gear of a speed regulator not shown, the gear 114 performs the function of setting the rotary conveyor in predetermined positions for intermittent advancement of jigs.

The entrance air lock chamber 115 comprising a housing 116 having an entrance gate 117 is connected to the front wall of the pre-heating chamber 103 at a lower position by an interior sealing device 123a, in this instance, a gate valve having a door 124a as shown in FIG. 3. An entrance transfer mechanism fixedly mounted to the front side of the chamber 115 includes an air cylinder 118a having a piston rod 120a with a slider 119. Pressurized air is supplied to the air cylinder 118a through a port 121a to impart movement to the piston rod 120a. The housing 116 is provided with a pair of guide rails 122 and 122' mounted therein between which a jig is loaded and along which the jig is transferred from the entrance chamber 115 to the pre-heating chamber by the movement of the piston rod 120a. The interior of the entrance chamber 117a is maintained at a vacuum source acting through a pipe 126a.

The exit air lock chamber 127 comprising a housing having an exit gate 128 is connected by a gate valve 120b to the rear wall of the pre-heating chamber 103 at a lower position as shown in FIG. 2. An exit transfer mechanism is provided on the front wall of the pre-heating chamber 103 at a position opposite to the exit air lock chamber 127. The exit transfer mechanism includes an air cylinder 118b having a piston rod not shown and a port 121b through which pressurized air is supplied to impart movement to the piston rod to transfer the processed jig from the pre-heating chamber to the exit air lock chamber. The interior of the exit chamber 127 is maintained at the vacuum source acting through a pipe 126b.

The first depositing chamber 131 is located on the left rear side of the pre-heating chamber and is connected by a gate valve 129a at a middle position. As shown in FIG. 3, the depositing chamber 131 comprises a bell jar 132 having a cap 133 and provided with a jig-supporting device located therein which comprises means for receiving and holding a jig 134 fixedly mounted on a rotatable ring 135. The ring 135 is placed on a number of anti-friction bearings 136 movably mounted on the integral annular flange 137 projecting from the inside wall of the bell jar 132 and is driven to rotation by a motor not shown. On the bottom of the bell jar 132, there is a resistance-heating board 138 containing a material to be deposited. Over the jig-supporting device, there is a heater 140 for controlling the temperature of atmosphere of the bell jar. The bell jar is pumped down to the desired vacuum through a duct 141a connected to a vacuum pump not shown. Mounted on the cap 133 is a sensor for measuring the thickness of the coating during the depositing operation. A first internal transfer mechanism, which is located on the front side of the pre-heating chamber opposite to the depositing chamber 131, is identical in structure to the entrance or exit transfer mechanism, but is somewhat different in performance therefrom. While the entrance or exit transfer mechanism is operated to move a jig in only one direction, the first internal transfer mechanism is operated to move a jig in either directions, so that the opposite end of the piston rod must have a gripping means such as a hook.

The second depositing chamber 142, which is located on the right rear side of the pre-heating chamber, is identical to the first depositing chamber 131. Also a second internal transfer mechanism provided for the second depositing chamber 142 is identical to the first internal transfer mechanism.

With such an apparatus, it is possible to control the pre-heating time in conformance with the time required for performing a depositing operation by a suitable combination of the number of jig-holders of the rotary conveyor with the number of steps in one advancement. Further it is possible to reduce the pre-heating time per jig to a substantially negligible level compared with the processing time as the number of jig-holders of the conveyor is increased. For example, the rotary conveyor according to one embodiment of the present invention shown in FIG. 4 carries an odd number of jig holders, in this instance, twenty-one jig holders, and is rotated for two step advance of jig-holders within the housing of the pre-heating chamber with which the entrance air lock chamber 115 communicates by an opening indicated at A, the first depositing chamber 131 communicates by an opening indicated at B, the second depositing chamber 142 communicates by an opening indicated at C, and the exit air lock chamber 127 communicates by an opening indicated at D. As the rotary conveyor is rotated in the direction of arrow R for two-step advance of jig-holders, a jig received in a jig-holder at position A moves past positions B, C and D in the first one revolution of the conveyor, but in the second one revolution, the jig stops at positions B, C and D, although it moves past position A. When the jig arrives the position B, the first internal transfer mechanism is operated to transfer the jig from the pre-heating chamber to the first depositing chamber 131 in which a depositing operation is performed for application of a coating on the one surfaces of the substrates carried on the jig. During the depositing procedure, the rotary conveyor is not permitted to rotate, so that upon completion of the depositing operation, the once-processed jig is moved to the same jig-holder. Next, the once processed jig stops at position C and is transferred to the second depositing chamber in which a depositing operation is performed for application of a coating on the opposite surfaces of the substrates. Upon completion of the depositing operation, the double processed jig is moved to the same jig holder again. Next, the double processed jig stops at position D and is transferred to the exit chamber, thereupon the jig-holder is prepared to receive an unprocessed jig at position A.

Figure 5:
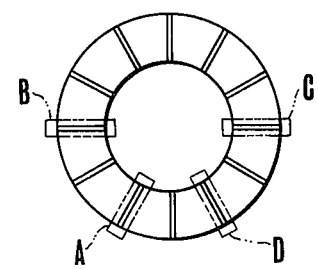
FIG. 5 is a sectional view similar to FIG. 4 schematically illustrating the apparatus of the present invention utilizing another embodiment of the rotary conveyor constructed in accordance with the present invention.

In FIG. 5, another example of the rotary conveyor constructed in accordance with the present invention is schematically illustrated as carrying an even number of jig-holders, in this instance, twelve jig-holders. In this case, the conveyor is rotated for one-step advance of jig-holders so that a jig received in a jig-holder at position A arrives position B in one revolution of the conveyor in a time interval too short for pre-heating treatment. Therefore, the initial one revolution of the conveyor is adapted only for the purpose of pre-heating the received jigs. In the next one revolution of the conveyor, successive two depositing operations are carried out in a manner similar to that described above, and the double processed jig arriving at position D is transferred to the exit chamber, thereupon the jig holder is prepared to receive an unprocessed jig in the third one revolution of the conveyor.

The operation of the apparatus is as follows. The pre-heating chamber in the entirely sealed position is pumped down to the desired vacuum. The entrance gate 117 is opened through which a jig carrying lenses rigidly secured therein is transported into and positioned between the guide rails 122 and 122' within the entrance air lock chamber 115. After the entrance gate is closed, the entrance chamber 115 is evacuated by a vacuum pumping system to reduce the pressure to a value almost equal to the pressure maintained in the pre-heating chamber. Then the internal sealing device in the form of a gate valve 123a is opened and the entrance transfer mechanism is operated to transfer the jig from the load position to a jig-holder in the form of a pair of an upper and lower grooved rails 105'' and 105''' within the pre-heating chamber. After the projected piston rod 120a is retarded to the initial position by applying pressurized air to the air cylinder 118a through a port 121a', the gate valve 123a is closed and the conveyor is rotated to advance the jig by two steps. In similar fashion, jigs are fed to the pre-heating chamber in sequence. As the conveyor is rotated, the jigs received in the jig-holders advance through the pre-heating chamber, thereby the lenses are heated during about one and quarter revolutions of the conveyor. When the first jig has arrived a position B, the closed gate valve 129a mounted in an opening B for communication with the first depositing chamber 131 of which the interior is maintained at a vacuum source acting through the duct 141a is opened, and then the first internal transfer mechanism is operated to move the jig to the jig-supporting devices 134 and 134'. After the projected piston rod is retarded to the initial position, the gate valve 129a is closed.

Next, the temperature and pressure in the first depositing chamber are controlled by the energized heater 140 and a vacuum pumping system acting through the duct 141a in order to provide a controlled atmosphere for application of a coating on the one surfaces of the lenses carried on the jig, while rotating the rotatable ring 136 of the jig-supporting device. When the thickness of the coating reaches a predetermined level, the atmosphere in the chamber is removed to terminate the depositing procedure. The gate valve 129a is opened again and pressurized air is supplied to the air cylinder 118d first through port 121d to project the piston rod to the jig supported on the jig-supporting device set at an initial load position, and then through port 121d' to move the jig to the same jig-holder of the conveyor, thereupon the gate valve 129a is closed.

In similar fashion, the opposite surfaces of the once processed lenses are coated by vacuum deposition in the second depositing chamber 142. When the double processed jig reaches the position D, the gate valve 120b mounted in the opening D is opened and then the exit transfer mechanism is operated to move the jig to the guide rails within the exit chamber of which the interior is maintained at a pressure almost equal to the pressure in the pre-heating chamber. After the gate valve 120b is closed, the exit gate is opened to remove the first jig from the guide rails within the exit chamber. Thus an operating cycle for the first jig comes to the end. It is preferred to employ a control circuit for the apparatus of the present invention. However, it is possible for the machine operator to control the intermittent advancement of jig-holders and operate the various transfer mechanism in succession while viewing the inside of the pre-heating chamber from outside.

It will be seen from the foregoing description that the number of work carriers carrying articles such as optical elements which may be processed at one time is increased by provision of a rotary conveyor constructed in accordance with the present invention within the pre-heating chamber. Further, the rotation of the conveyor causes each of the work carriers which the conveyor is transporting through the pre-heating chamber to be inverted automatically in half revolution, so that it is made possible to perform the double processing of articles for successive applications of a thin film coating on the opposite surfaces of the article without permitting the articles to be exposed to the ambient atmosphere during processing by provision of two identical depositing chambers arranged in the symmetrical relation to each other with respect to the shaft of conveyor within the pre-heating chamber. Because the pre-heating chamber is completely sealed from the ambient atmosphere, it is not necessary to provide additional facilities for pre-cleaning the once processed articles before they are subjected to the second depositing operation. For the continuous processing of articles through the vacuum depositing apparatus of the invention, a rotary conveyor provided with an odd number of holder for receiving and holding work carriers carrying articles rigidly secured therein may be employed and rotated for two-step advance. Since certain changes may be made in the above apparatus without departing from the scope of the invention herein involved, it is intended that all matters contained in the above description or shown in the accompanying drawings shall be interpreted as illustrative and not in a limiting sense.

What we claim is:

1. A vacuum deposition apparatus for treating articles comprising an annular chamber including means for heating said articles, article holder means rotatably mounted within the chamber for orbiting said articles within said annular chamber, sealable chamber means for passing articles into and out of said annular chamber including means for continuously maintaining said annular chamber sealed from its external environment, deposition chamber means for treating articles disposed therein, means defining sealable path means through which said articles may be transferred in both directions between said annular chamber and said deposition chamber means, and means to effect said transfer.

2. Apparatus according to claim 1 wherein said sealable chamber means comprise an entrance chamber for introducing articles into said annular chamber, an exit chamber for removing articles from said annular chamber, sealable path means for enabling transfer of articles between each of said entrance and exit chambers and said annular chamber, portal means for enabling introduction of articles into said entrance chamber from the exterior of said apparatus and for enabling removal of articles from said exit chamber to the exterior of said apparatus, means for normally maintaining said portal means sealed and for unsealing said portal means to permit passage of articles therethrough, and means for maintaining said sealable path means sealed when said portal means are unsealed.

3. Apparatus according to claim 1 wherein said deposition chamber means comprise a pair of deposition chambers oppositely disposed relative to said annular chamber and located to receive, respectively, said articles in opposed positions.

4. Apparatus according to claim 1 wherein said means for orbiting said articles comprise a rotatable conveyer rotatably mounted relative to said annular chamber and including a plurality of holders for receiving and releasably holding said articles.

5. Apparatus according to claim 4 wherein said articles comprise a generally planar configuration and wherein said rotatable conveyer includes a central drive shaft with said holders being arranged relative thereto to receive and hold said articles within a plane including the axis of said drive shaft.

6. Apparatus according to claim 5 wherein said rotatable conveyer is disposed with said drive shaft arranged in a substantially horizontal plane.

7. Apparatus according to claim 5 wherein said rotatable conveyer comprises an odd number of said holders.

8. Apparatus according to claim 1 wherein said sealable chamber means include an entrance chamber for introducing articles into said annular chamber and an exit chamber for receiving articles therefrom, wherein said deposition chamber means include a pair of deposition chambers oppositely disposed relative to said annular chamber, and wherein said entrance chamber, said exit chamber and each of said deposition chambers are spaced apart circumferentially about said annular chamber at different locations along the path of rotation of said articles within said annular chamber.

* * * * *